United States Patent
Mooney et al.

(10) Patent No.: US 7,180,352 B2
(45) Date of Patent: Feb. 20, 2007

(54) CLOCK RECOVERY USING CLOCK PHASE INTERPOLATOR

(75) Inventors: Stephen R. Mooney, Beaverton, OR (US); Bryan K. Casper, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 886 days.

(21) Appl. No.: 09/894,486

(22) Filed: Jun. 28, 2001

(65) Prior Publication Data

US 2003/0002607 A1 Jan. 2, 2003

(51) Int. Cl.
*H03H 11/16* (2006.01)

(52) U.S. Cl. ........................ 327/237; 327/246

(58) Field of Classification Search ........ 327/231–237, 327/240, 246
See application file for complete search history.

(56) References Cited

U.S. PATENT DOCUMENTS

| | | | |
|---|---|---|---|
| 5,128,962 A | 7/1992 | Kerslake et al. | |
| 5,148,381 A | 9/1992 | Sprague | |
| 5,164,960 A | 11/1992 | Winen et al. | |
| 5,479,652 A | 12/1995 | Dreyer et al. | |
| 5,489,864 A | 2/1996 | Ashuri | |
| 5,541,535 A | 7/1996 | Cao et al. | |
| 5,568,064 A | 10/1996 | Beers et al. | |
| 5,572,158 A * | 11/1996 | Lee et al. | 327/175 |
| 5,604,450 A | 2/1997 | Borkar et al. | |
| 5,608,343 A * | 3/1997 | Ojima et al. | 326/93 |
| 5,641,931 A | 6/1997 | Ogai et al. | |
| 5,666,302 A | 9/1997 | Tanaka et al. | |
| 5,754,062 A * | 5/1998 | Satoh et al. | 326/126 |
| 5,799,051 A * | 8/1998 | Leung et al. | 375/376 |
| 5,905,391 A | 5/1999 | Mooney | |
| 6,040,714 A | 3/2000 | Klein | |
| 6,073,151 A | 6/2000 | Baker et al. | |
| 6,121,808 A | 9/2000 | Gaudet | |
| 6,122,336 A * | 9/2000 | Anderson | 375/371 |
| 6,150,862 A | 11/2000 | Vikinski | |

(Continued)

FOREIGN PATENT DOCUMENTS

JP 05-129908 5/1993

(Continued)

OTHER PUBLICATIONS

Donnelly, K.S., et al., "A 660MB/s Interface Megacell Portable Circuit in -.3 mum-0.7 mum CMOS ASIC", *IEEE Journal of Solid-State Circuits, vol. 32*, 1995-2003, (Dec. 1996).

(Continued)

*Primary Examiner*—Timothy P. Callahan
*Assistant Examiner*—Cassandra Cox
(74) *Attorney, Agent, or Firm*—Schwegman, Lundberg, Woessner & Kluth, P.A.

(57) ABSTRACT

A clock recovery circuit includes a delay locked loop, and a clock phase interpolator circuit. The delay locked loop provides multiple phases of an input clock signal to the interpolator circuit, which interpolates between two of the clock phases to provide a clock signal at a desired phase. The clock phase interpolator circuit includes selectable differential transistor pairs coupled to variable current sources. Different differential transistor pairs are driven by clock signals of different phases provided by the delay locked loop circuit. Two differential transistor pairs are selected, and currents provided to the selected differential transistor pairs are adjusted to provide an output clock of the desired phase.

26 Claims, 9 Drawing Sheets

U.S. PATENT DOCUMENTS

| | | |
|---|---|---|
| 6,239,642 B1 | 5/2001 | Kim et al. |
| RE37,452 E * | 11/2001 | Donnelly et al. ............ 327/255 |
| 6,348,826 B1 | 2/2002 | Mooney et al. |
| 6,424,585 B1 | 7/2002 | Ooishi |
| 6,438,721 B1 * | 8/2002 | Wente ......................... 714/731 |
| 6,445,229 B1 | 9/2002 | Schenck et al. |
| 6,539,072 B1 * | 3/2003 | Donnelly et al. ............ 375/371 |
| 6,570,944 B2 * | 5/2003 | Best et al. ................... 375/355 |
| 6,583,655 B2 | 6/2003 | Takahashi et al. |
| 6,614,319 B2 | 9/2003 | Saeki et al. |
| 6,621,317 B2 | 9/2003 | Saeki |
| 6,642,760 B1 | 11/2003 | Alon et al. |
| 6,642,800 B2 | 11/2003 | Drapkin et al. |
| 6,703,902 B2 | 3/2004 | Jeon et al. |
| 6,748,549 B1 | 6/2004 | Chao et al. |
| 6,759,881 B2 * | 7/2004 | Kizer et al. .................. 327/147 |
| 6,774,686 B2 | 8/2004 | Kennedy et al. |
| 6,794,912 B2 | 9/2004 | Hirata et al. |
| 6,822,488 B1 | 11/2004 | Riley |
| 2005/0140417 A1 | 6/2005 | Patel et al. |

OTHER PUBLICATIONS

Lee, T.H., et al., "A 2.5 V CMOS Delay-Locked Loop for an 18 Mbit, 500 Megabyte/s DRAM", *IEEE Journal of Solid-State Circuits, vol. 29*, 1491-1496 (Dec. 1994).

Sidiropoulos, S., et al., "A Semidigital Dual Delay-Locked Loop", *IEEE Journal of Solid-State Circuits, vol. 32*, 1683-1692, (Nov. 1997).

Haycock, Matthew, et al., "A 2.5Gb/s Bidirectional Signaling Technology", *Hot Interconnects Symposium V*, (Aug. 1997), pp. 1-8.

* cited by examiner

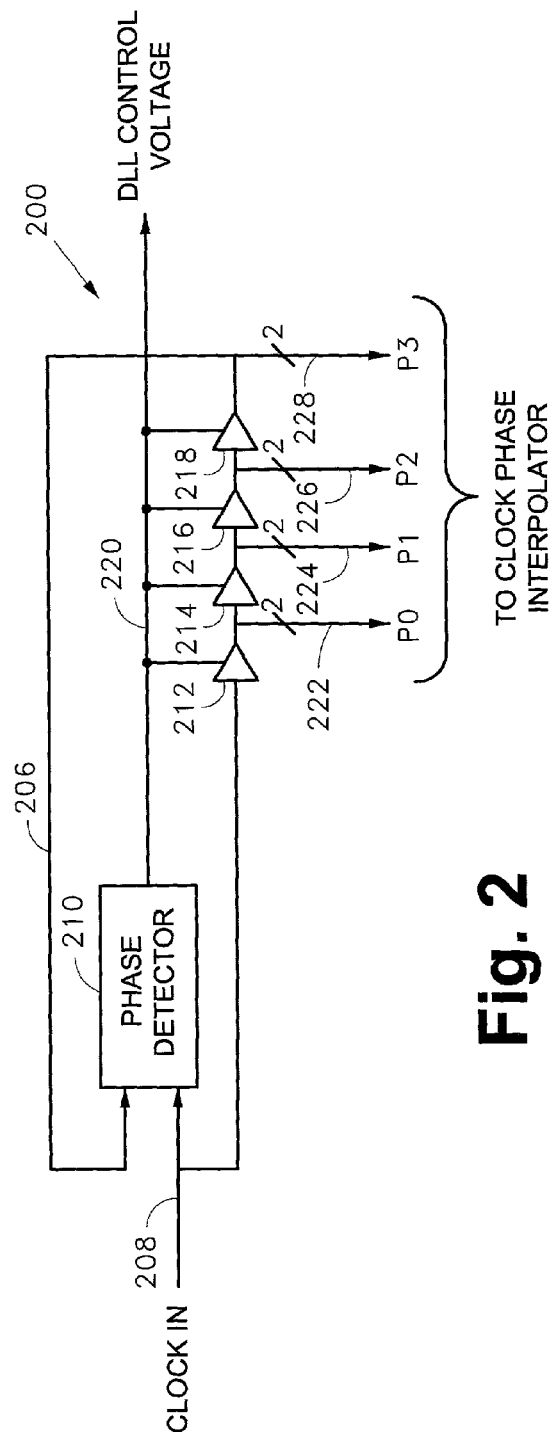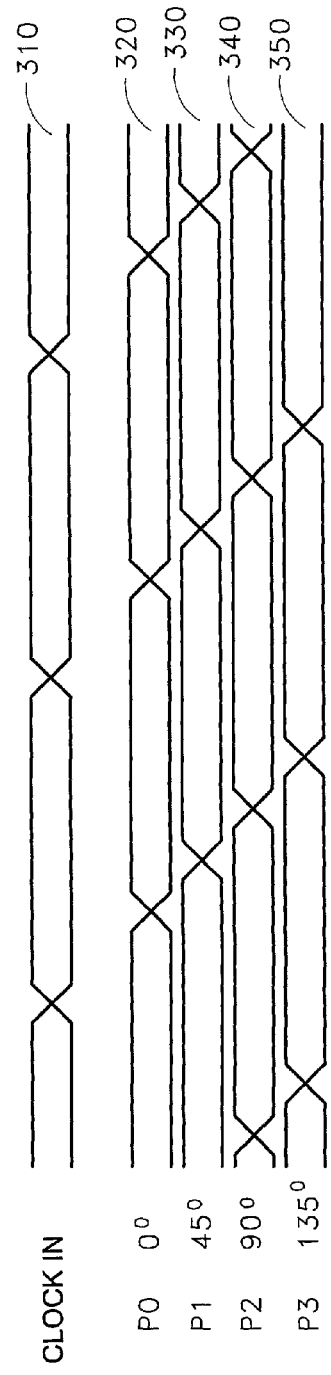

CLOCK RECOVERY USING CLOCK PHASE INTERPOLATOR

FIELD

The present invention relates generally to clock recovery in communications systems, and more specifically to fine phase control of a recovered clock.

BACKGROUND OF THE INVENTION

Modern integrated circuits are becoming smaller, more dense, and faster. The increased density and speed of integrated circuits (chips) has resulted in chips with internal operating frequencies far higher than external operating frequencies. For example, the internal clock frequencies of some microprocessors have increased from a few megahertz (MHz) 20 years ago, to over one gigahertz (GHz) today, while external operating frequencies have generally stalled at less than 100 MHz.

The overall performance of some integrated circuits is reduced because of lower external operating frequencies. For example, an integrated circuit that transmits or receives a significant amount of data may have to "stall" internal operations while the external interface "catches up" with the faster internal circuitry.

Reliable high speed data transmission between integrated circuits is hampered in part by phase jitter and clock skew as data signals and clock signals travel between the integrated circuits. Circuits have been developed to "recover" the phase of clock signals as they are received by integrated circuits. Clock recovery aids in the alignment of the phase of the clock signal with a received data signal in order to increase reliability of the received data. See, for example, Stephanos Sidiropoulos and Mark A. Horowitz, "A Semi-digital Dual Delay Locked Loop," IEEE Journal of Solid State Circuits, Volume 32, No. 11, November 1997. As the external operating frequencies continue to increase, finer phase control in clock recovery circuits can further increase reliability.

For the reasons stated above, and for other reasons stated below which will become apparent to those skilled in the art upon reading and understanding the present specification, there is a need in the art for a method and apparatus to provide fine phase control in clock recovery circuits.

BRIEF DESCRIPTION OF THE DRAWINGS

FIG. 2 shows a delay locked loop;

FIG. 3 shows waveforms produced by the delay locked loop of FIG. 2;

DESCRIPTION OF EMBODIMENTS

Figure 1:
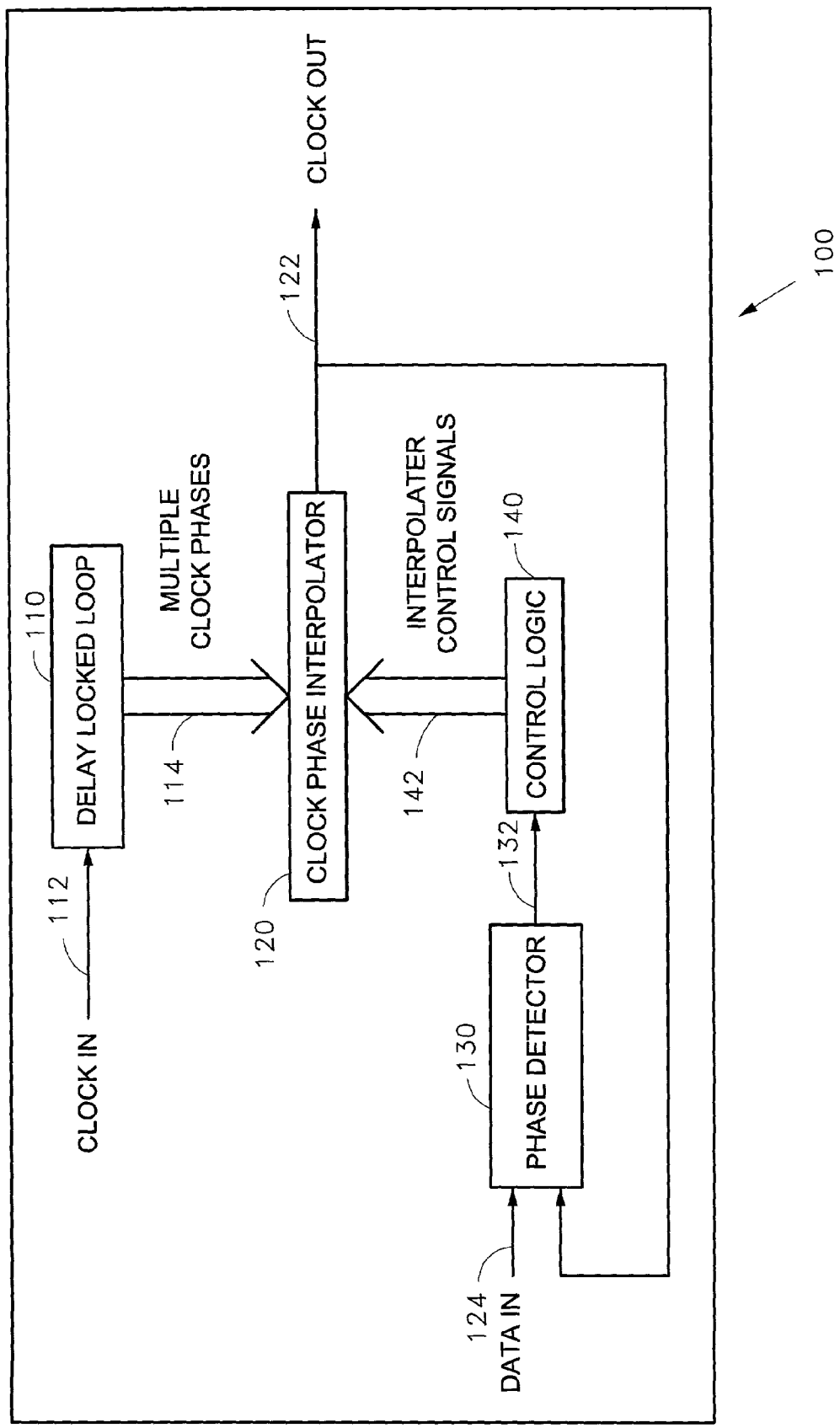
FIG. 1 shows an integrated circuit with a clock recovery circuit.

In the following detailed description of the embodiments, reference is made to the accompanying drawings that show, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. Moreover, it is to be understood that the various embodiments of the invention, although different, are not necessarily mutually exclusive. For example, a particular feature, structure, or characteristic described in one embodiment may be included within other embodiments. The following detailed description is, therefore, not to be taken in a limiting sense, and the scope of the present invention is defined only by the appended claims, along with the fill scope of equivalents to which such claims are entitled.

The method and apparatus of the present invention provide a mechanism to recover a clock signal with fine phase adjustments. A delay locked loop circuit provides multiple clock phases, and a clock phase interpolator circuit interpolates between the clock phases to provide fine phase adjustment. The clock phase interpolator circuit utilizes differential transistor pairs to mix currents from various clock phases to provide the desired phase.

FIG. 1 shows an integrated circuit with a clock recovery circuit. Integrated circuit 100 includes delay locked loop 110, clock phase interpolator 120, phase detector 130, and control logic 140.

Delay locked loop 110 receives an input clock on node 112 and produces multiple clock phases on node 114. Node 114, like many nodes throughout the several figures, is shown schematically as a single line, but in implementation, node 114 can be many physical nodes, lines, or traces. In different embodiments of the present invention, delay locked loop 110 produces a different number of clock phases on node 114. For example, in some embodiments delay locked loop 110 produces four clock phases on node 114, and in other embodiments delay locked loop 110 produces eight clock phases on node 114. A delay locked loop is shown and described in mode detail below with reference to FIG. 2.

Delay locked loop 110 is an example circuit that can provide multiple clock phases from which to interpolate. Other circuits that produce multiple phases of the clock can be substituted for delay locked loop 110 without departing from the scope of the present invention. For example, a phase locked loop can be utilized to provide multiple phases of the clock.

Clock phase interpolator 120 receives multiple clock phases on node 114 and produces an output clock signal on node 122. Clock phase interpolator 120 also receives interpolator control signals on node 142 from control logic 140. Clock phase interpolator 120 interpolates between the multiple clock phases received on node 114 as a function of the state of the interpolator control signals. A clock phase interpolator is shown and described in more detail below with reference to FIG. 7.

Interpolator control signals on node 142 are produced by control logic 140 in response to a phase error signal on node 132 produced by phase detector 130. Phase detector 130 produces the phase error signal on node 132 in response to an input data signal on node 134 and the output clock signal on node 122. A control logic circuit and a phase detector are shown and described in more detail below with reference to FIGS. 9 and 10, respectively.

The circuit shown in FIG. 1 can be useful to provide fine phase control of the output clock signal on node 122, thereby allowing a close phase match between the output clock signal on node 122 and the input data on node 134. In some embodiments, the input data on node 134 and the input clock signal on node 112 are received from points external to integrated circuit 100. In these embodiments, the circuit of FIG. 1 is a clock recovery circuit that recovers the clock phase that aligns with the input data. For example, the circuit of FIG. 1 can be useful to capture a data stream of unknown phase entering integrated circuit 100.

In other embodiments, the input data on node 134 and the input clock on node 112 are received from other circuits within integrated circuit 100. In these embodiments, the circuit shown in FIG. 1 is a clock recovery circuit that recovers the phase of data internal to integrated circuit 100. For example, the circuit of FIG. 1 can be useful for recovering clocks of varying phases within a data path of a microprocessor.

In some embodiments, multiple input data signals are received, and a single input data signal is used in the clock recovery circuit. For example, input data signal on node 134 can be a least significant bit of a 32 bit data bus, where the other 31 data bits are not utilized for clock recovery. In other embodiments, each input data signal has associated therewith a clock recovery circuit such as represented in FIG. 1. In very high speed applications, a separate clock recovery circuit for each input data signal can be useful to produce separate clock signals, each having a phase matched to a separate input data signal.

Integrated circuit 100 can be any type of integrated circuit capable of including a clock recovery circuit. For example, integrated circuit 100 can be a processor such as a microprocessor, a digital signal processor, a microcontroller, or the like. Integrated circuit 100 can also be an integrated circuit other than a processor such as an application-specific integrated circuit (ASIC), a communications device, a memory controller, or a memory such as a dynamic random access memory (DRAM).

FIG. 2 shows a delay locked loop (DLL). DLL 200 is an example embodiment of a delay locked loop suitable for use as delay locked loop 110 (FIG. 1). DLL 200 includes phase detector 210 that receives an input clock on node 208 and a feedback clock on node 206. In response to a phase difference between the two input clock signals, phase detector 210 produces a DLL control voltage on node 220. The DLL control voltage on node 220 controls a delay of variable delay elements 212, 214, 216, and 218. Variable delay elements 212, 214, 216, and 218 produce different phases of the input clock signal on nodes 222, 224, 226, and 228, respectively.

In embodiments represented by FIG. 2, four separate clock phases are generated, labeled P0, P1, P2, and P3. These clock phases correspond to the multiple clock phases on node 114 (FIG. 1). Also in the embodiments represented by FIG. 2, four variable delay elements are included that provide a delay substantially equal to 180° of phase shift at the frequency of the input clock. This provides four clock phases at substantially 45° increments, shown as 0°, 45°, 90°, and 135° in FIG. 3. In other embodiments, more or less than four variable delay elements can be included, thereby providing finer phase control out of DLL circuit 200. Furthermore, in other embodiments, the sum of the delay of the variable delay elements can be equal to 360° of the input clock signal, thereby providing more output phase signals.

In general, any number of variable delay elements can be included without departing from the scope of the present invention.

FIG. 3 shows waveforms produced by the delay locked loop circuit of FIG. 2. Waveform 310 corresponds to the input clock signal on node 208. Likewise, waveform 320 shows the phase relationship of the clock signal on node 222, waveform 330 shows the phase relationship of the clock signal on node 224, waveform 340 shows the phase relationship of the clock signal on node 226, and waveform 350 shows the phase relationship of the clock signal on node 228. Clock signals are provided at 0°, 45°, 90°, and 135°. In some embodiments, the phase signals output from delay locked loop 110 (FIG. 1) are differential signals. This is illustrated in FIG. 2 where each clock phase is shown having two nodes. In embodiments that include differential signals, additional phase angles can be achieved by inverting the differential signals. For example, P0 can be inverted to produce a clock phase at 180°, P1 can be inverted to produce a clock signal at 225°, P2 can be inverted to produce a clock signal at 270°, and P3 can be inverted to produce a clock signal at 315°.

Figure 4:
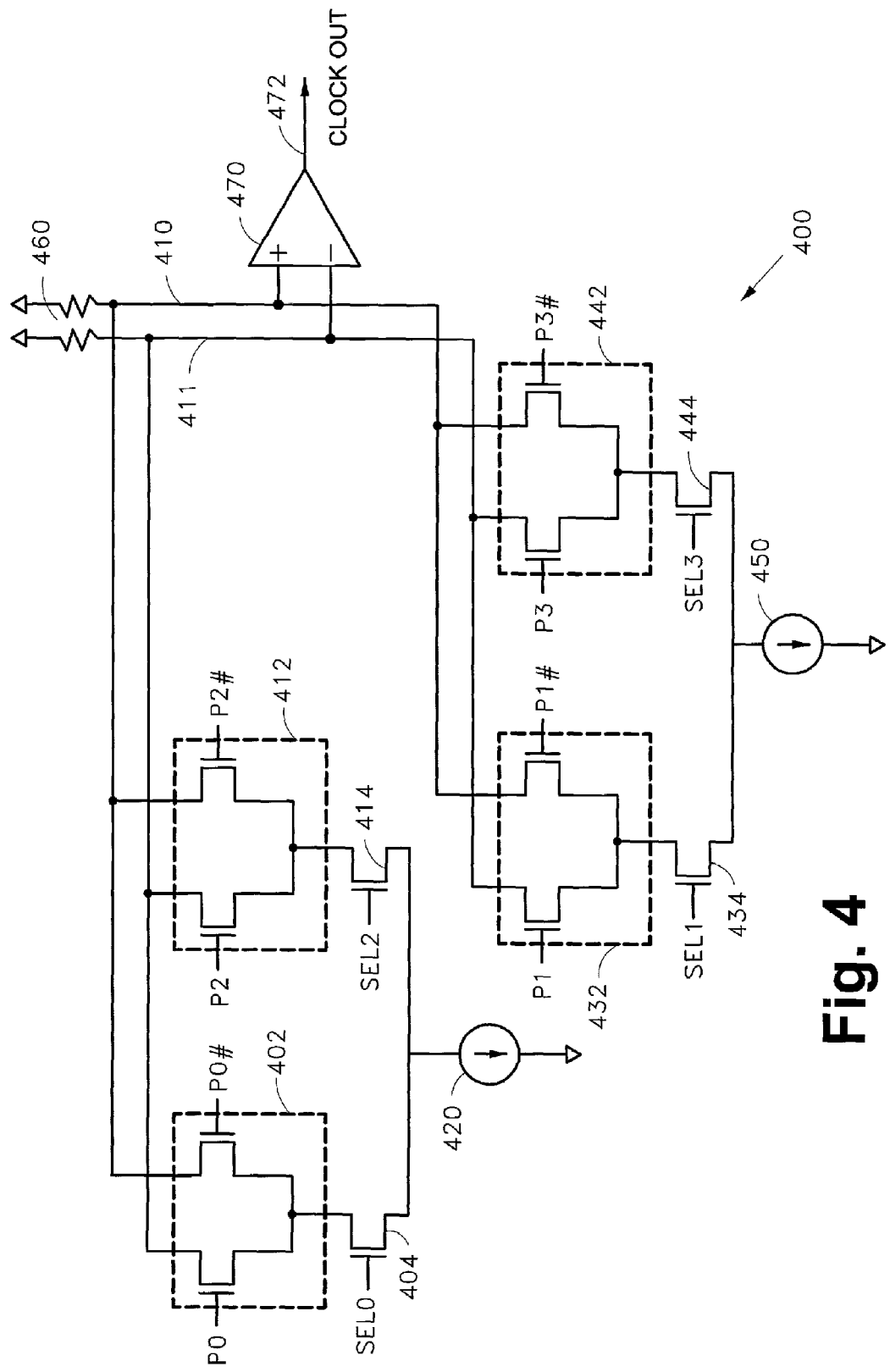
FIG. 4 shows a clock phase interpolator.

FIG. 4 shows a clock phase interpolator. Clock phase interpolator circuit 400 includes differential transistor pairs 402, 412, 432, and 442, select transistors 404, 414, 434, and 444, current sources 420 and 450, load devices 460, and differential amplifier 470. Differential transistor pair 402 receives the differential signal P0 on node 222 (FIG. 2) as an input signal. Likewise, differential transistor pair 432 receives P1, differential transistor pair 412 receives P2, and differential transistor pair 442 receives P3. Each of the clock phase signals (P0–P3) includes a clock signal and its complement to form a differential pair. For example, Px and Px# form the differential pair for Px, where x is a value from 0 to 3. This naming convention is used throughout this description. Select transistors 404, 414, 434, and 444 are each responsive to a control signal labeled SEL0, SEL2, SEL1, and SEL3, respectively. The SEL signals are control signals provided by control logic such as control logic 140 (FIG. 1).

The differential transistor pairs shown in FIG. 1 include n-channel isolated gate field effect transistors. In some embodiments, the n-channel isolated gate field effect transistors are n-channel metal oxide semiconductor field effect transistors (NMOSFETs). The choice of NMOSFETs for use in the figures is strictly one of convenience. The method and apparatus of the present invention can be practiced with other types of components such as p-channel isolated gate field effect transistors and bipolar junction transistors. A great number of suitable component types exist to practice the various embodiments of the invention, and a choice of any of these component types can be made without departing from the scope of the present invention.

Different differential transistor pairs can be selected using the select transistors. As a result, the current sourced by current sources 420 and 450 is switched between the various differential transistor pairs. For example, when select transistors 404 and 434 are on, and select transistors 414 and 444 are off, differential transistor pairs 402 and 432 have current flowing therethrough and differential transistor pairs 412 and 442 do not have current flowing therethrough. Differential transistor pair 402 switches current between nodes 410 and 411 at the frequency of the input clock signal and at the phase of the clock phase signals that drive differential transistor pair 402. Likewise, differential transistor pair 432 switches current between nodes 410 and 411 at a clock phase equal to the phase of the signal driving differential transistor pair 432. In the example just described, one differential transistor pair is switching current at a phase of 0°, and a second differential transistor pair is switching current at 45°. These currents on nodes 410 and 411 produce a voltage across load devices 460. The voltages across load devices 460 are input voltages to a differential amplifier 470. Differential amplifier 470 provides an output clock signal on node 472. The phase of the output clock signal on node 472 is substantially equal to the center point between the two differential transistor pairs selected. For example, when differential transistor pairs 402 and 432 are selected, the output clock signal on node 472 is at substantially 22.5° plus any delay attributable to differential amplifier 470.

Differential transistor pairs 402 and 412 form a first plurality of differential transistor pairs coupled to a current source through select transistors. Each of differential transistor pairs 402 and 412 are connected to the same current source 420 through select transistors 404 and 414. Likewise, differential transistor pairs 432 and 442 form a second plurality of differential transistor pairs coupled to a current source through select transistors. Each of differential transistor pairs 432 and 442 are connected to current source 450 through select transistors 434 and 444.

Load devices 460 are shown as resistors in FIG. 4. In some embodiments, load devices 460 are active load devices such as transistors. In general, load devices 460 can be any circuit or sub-circuit that provide a load to allow a voltage to be developed at the inputs to differential amplifier 470.

In operation, one of the first plurality of differential transistor pairs is selected and one of the second plurality of differential transistor pairs is selected to provide an output clock signal on node 472 with an interpolated phase. The phase of the output clock signal is interpolated between the two differential transistor pairs selected. In the example set forth above, differential transistor pairs operating at 0° and 45° were selected to yield an output clock signal at substantially 22.5°. The control logic driving the select transistors select the differential transistor pairs having the desired phase relationship to produce an output clock signal on node 472 having the desired phase.

In embodiments represented by clock phase interpolator 400, four clock phases are received, and interpolation is provided between each of the four clock phases. In other embodiments, more than four clock phases are provided. In some embodiments, this corresponds to a delay locked loop having more than four variable delay elements. In other embodiments, it corresponds to the utilization of additional clock phases available through the inversion of differential signals. One such utilization is shown and described below with reference to FIG. 7.

Figure 5:
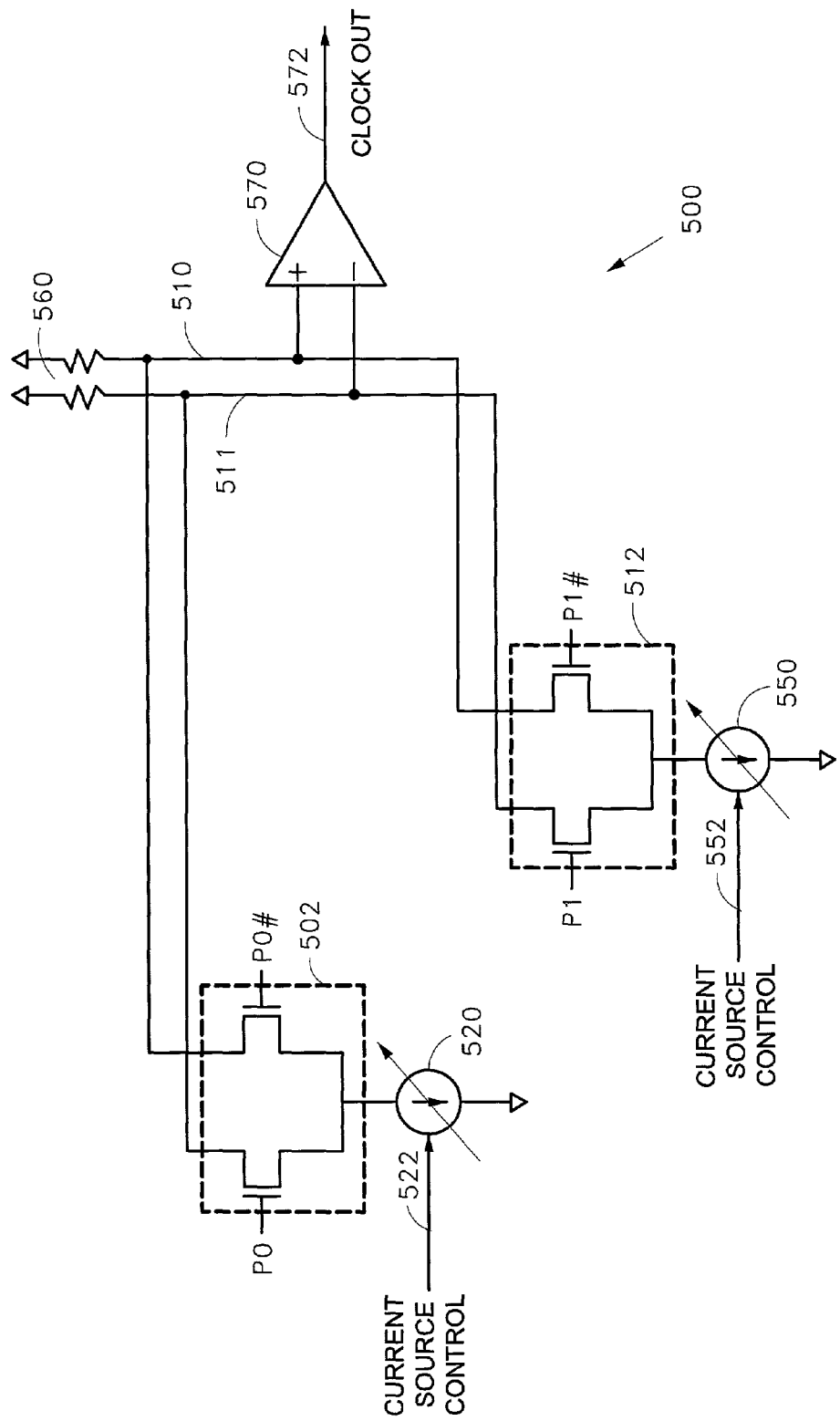
FIG. 5 shows another clock phase interpolator.

FIG. 5 shows another clock phase interpolator. Clock phase interpolator 500 includes differential transistor pairs 502 and 512, load devices 560, and differential amplifier 570. Differential transistor pairs 502 and 512 each receive a clock signal having a desired phase relationship. In the example shown in FIG. 5, differential transistor pair 502 receives P0 at 0° and differential transistor pair 512 receives P1 at 45°.

Current provided by current source 520 is switched between the transistors in differential transistor pair 502 and current provided by current source 550 is switched between the transistors and differential transistor pair 512. These currents combine on nodes 510 and 511 to produce voltages across load devices 560. These voltages are input to differential amplifier 570 which produces an output clock signal on node 572. Current sources 520 and 550 are variable current sources, each having a current set by signals on current source control nodes 522 and 552. The current source control data on nodes 522 and 552 is provided by a control logic circuit such as control logic circuit 140 (FIG. 1).

By varying the amount of current sourced by current sources 520 and 550, the clock phases input to differential transistor pairs 502 and 512 can be mixed by varying amounts to produce a variable phase on the output clock signal on node 572. For example, when current source 520 provides more current than current source 550, the output clock signal will have a phase closer to that of P0 than to P1. Likewise, when current source 550 sources more current than current source 520, the output clock signal will have a phase closer to that of P1 than to P0.

In the embodiments represented by FIG. 5, two differential transistor pairs exist, each receiving a clock signal at a different phase. As shown in FIG. 5, the two clock phases are represented as 0° and 45°. Any clock phase can be used without departing from the scope of the present invention. For example, differential transistor pair 502 can receive a clock phase at 135°, and differential transistor pair 512 can receive a clock signal at 145°, thereby allowing an output clock signal to be interpolated between these two phases.

Figure 6:
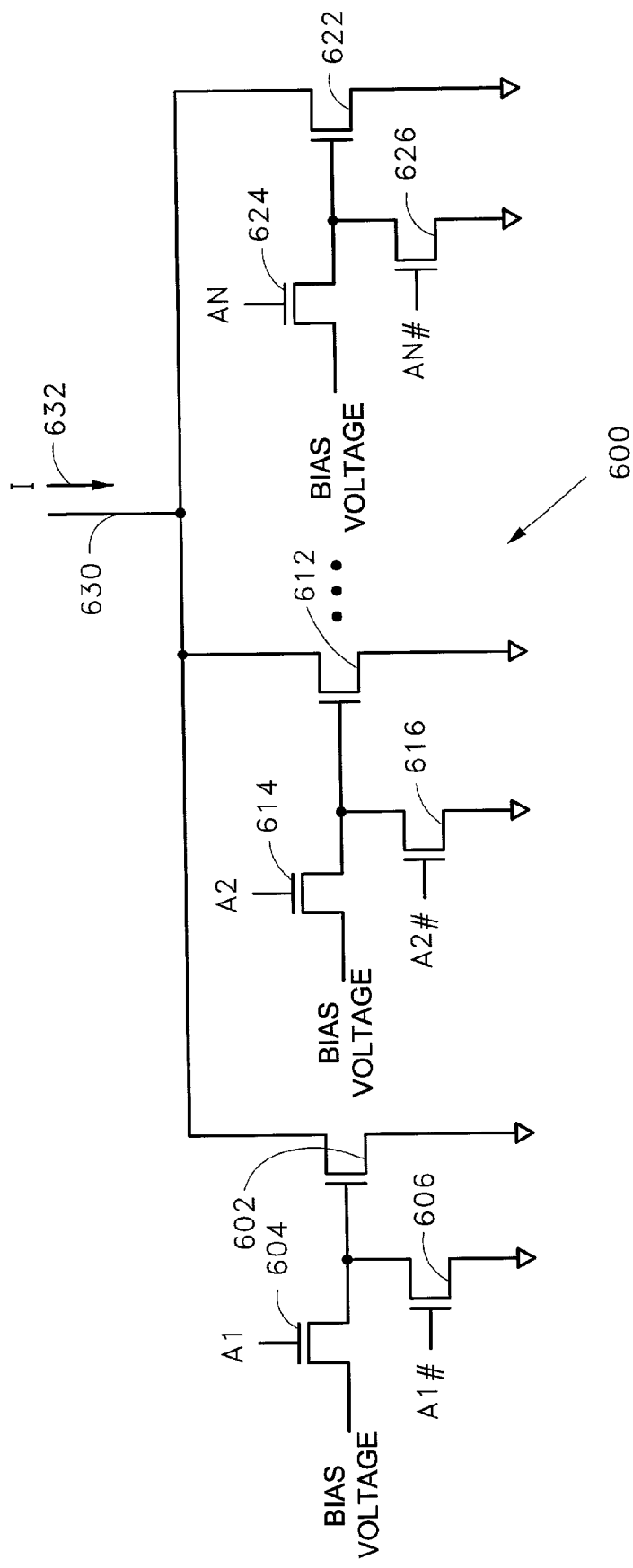
FIG. 6 shows a variable current source.

FIG. 6 shows a variable current source. Current source 600 includes a plurality of selectable current source circuits. For example, one selectable current source circuit includes current source transistor 602 and select transistors 604 and 606. Likewise, another selectable current source circuit includes current source transistor 612 and select transistors 614 and 616. Furthermore, another selectable current source circuit includes current source transistor 622 and select transistors 624 and 626. Current source 600 is shown having three selectable current source circuits, but any number of selectable current source circuits can be included without departing from the scope of the present invention. Variable current source 600 can be utilized as a variable current source such as current source 520 or 550 (FIG. 5). In these embodiments, the signals shown controlling pass transistors 604, 606, 614, 616, 624, and 626 are current source control signals provided to vary the amount of current 632 supplied by variable current source 600 on node 630.

In operation, a current source transistor is selected by varying the signals controlling the select transistors connected thereto. For example, current source transistor 602 has a gate coupled to a bias voltage through select transistor 604 and coupled to a reference potential through select transistor 606. When control signal A1 is asserted, select transistor 604 conducts and select transistor 606 does not. As a result, current source transistor 602 has the bias voltage imposed from gate to source thereby providing a current that contributes to current 632 on node 630. When control signal A1 is de-asserted, select transistor 604 is off and select transistor 606 is on, thereby coupling the gate of current source transistor 602 to the reference potential and turning current source transistor 602 off.

Any number of current source transistors can be on, and any number of current source transistors can be off, based on the values of the control signals shown in FIG. 6. In embodiments represented by FIG. 6, each current source transistor sources substantially the same current when the bias voltage is applied to the gate. In other embodiments, different bias voltages are provided to the different current source transistors, thereby providing a different weight to each selectable current source circuit. In still other embodiments, each current source transistor is a different size, thereby providing a different amount of current from the same bias voltage. For example, each current source transistor can be sized in a binary fashion such that a binary control word can be applied to variable current source 600 to provide a greater range of current values.

Figure 7:
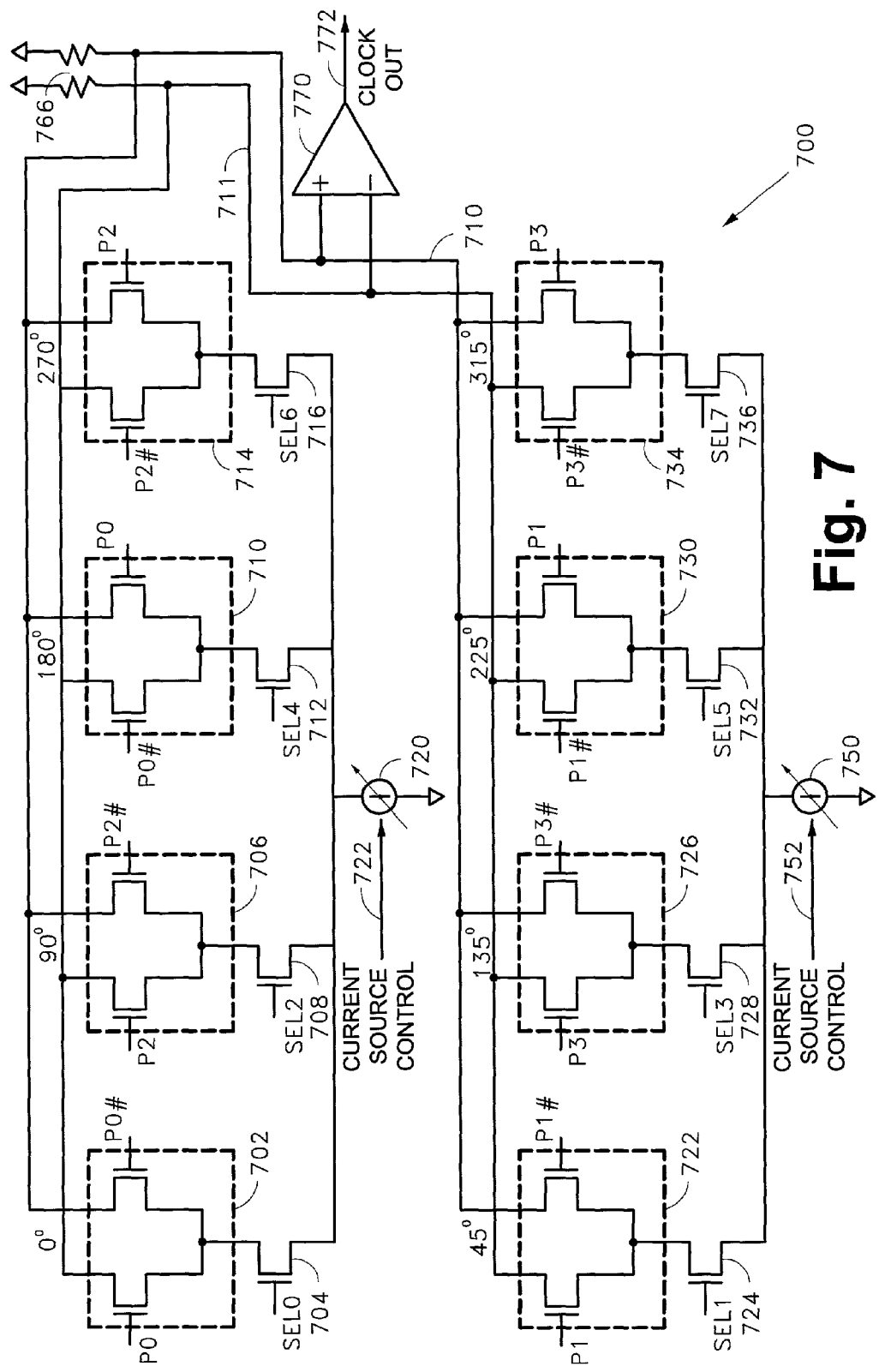
FIG. 7 shows another clock phase interpolator.

FIG. 7 shows another clock phase interpolator. Clock phase interpolator 700 includes two pluralities of differential transistor pairs, each coupled to a variable current source through select transistors. For example, differential transistor pairs 702, 706, 710, and 714 are each coupled to variable current source 720 through select transistors 704, 708, 712, and 716, respectively. Likewise, differential transistor pairs 722, 726, 730, and 734 are coupled to variable current source 750 through select transistors 724, 728, 732, and 736, respectively. As shown in FIG. 7, the plurality of differential transistor pairs coupled to variable current source 720 correspond to clock phases of 0°, 90°, 180°, and 270°. Clock phases of 0° and 90° are provided by clock phase signals in the same manner as previously described with reference to FIG. 4. Clock phase signals of 180° and 270° are provided by logically inverting the clock phase signals that provide 0° and 90°, respectively. The logical inversion is accomplished by switching the ordering of connections of the differential signals. For example, differential transistor pair 702 has P0 connected to the leftmost transistor and P0# connected to the rightmost transistor, whereas the connections are reversed for differential transistor pair 710. The second plurality of differential transistor pairs provides clock phases of 45°, 135°, 225°, and 315° in the same manner.

In operation, one of the first plurality of differential transistor pairs is selected using one of select transistors 704, 708, 712, and 716, and one of the second plurality of differential transistor pairs is selected using select transistors 724, 728, 732, and 736. These two clock phases are mixed by varying amounts based on the currents sourced by variable current sources 720 and 750. For example, an output clock with a relative phase of between 90° and 135° can be achieved by selecting differential transistor pairs 706 and 726 using select transistors 708 and 728, respectively, and varying the current provided by variable current sources 720 and 750 using current source control signals on nodes 722 and 752, respectively. The currents switched by the two differential transistor pairs are summed at nodes 710 and 711, thereby producing voltages across load devices 760. These voltages are sensed by differential amplifier 770 to produce an output clock signal on node 772 with the desired phase.

The control signals for clock phase interpolator 700 include select signals to turn on and off select transistors, and current source control signals on nodes 722 and 752. These control signals are digital signals that can be provided by any suitable digital circuit. For example, in some embodiments, the control signals shown in FIG. 7 correspond to the interpolator control signals on node 142 (FIG. 1). Control signals having digital voltage levels can be useful for many reasons, including the ability to test the output clock phase under controlled laboratory conditions using readily available digital test equipment.

Clock phase interpolator 700 accomplishes the interpolation of clock phases in one circuit stage, reducing both power consumption and jitter. By selecting two differential transistor pairs, static power is reduced to that consumed by two transistor pairs, and by performing the interpolation in a single circuit, jitter commonly caused by power supply noise in digital components is reduced.

Figure 8:
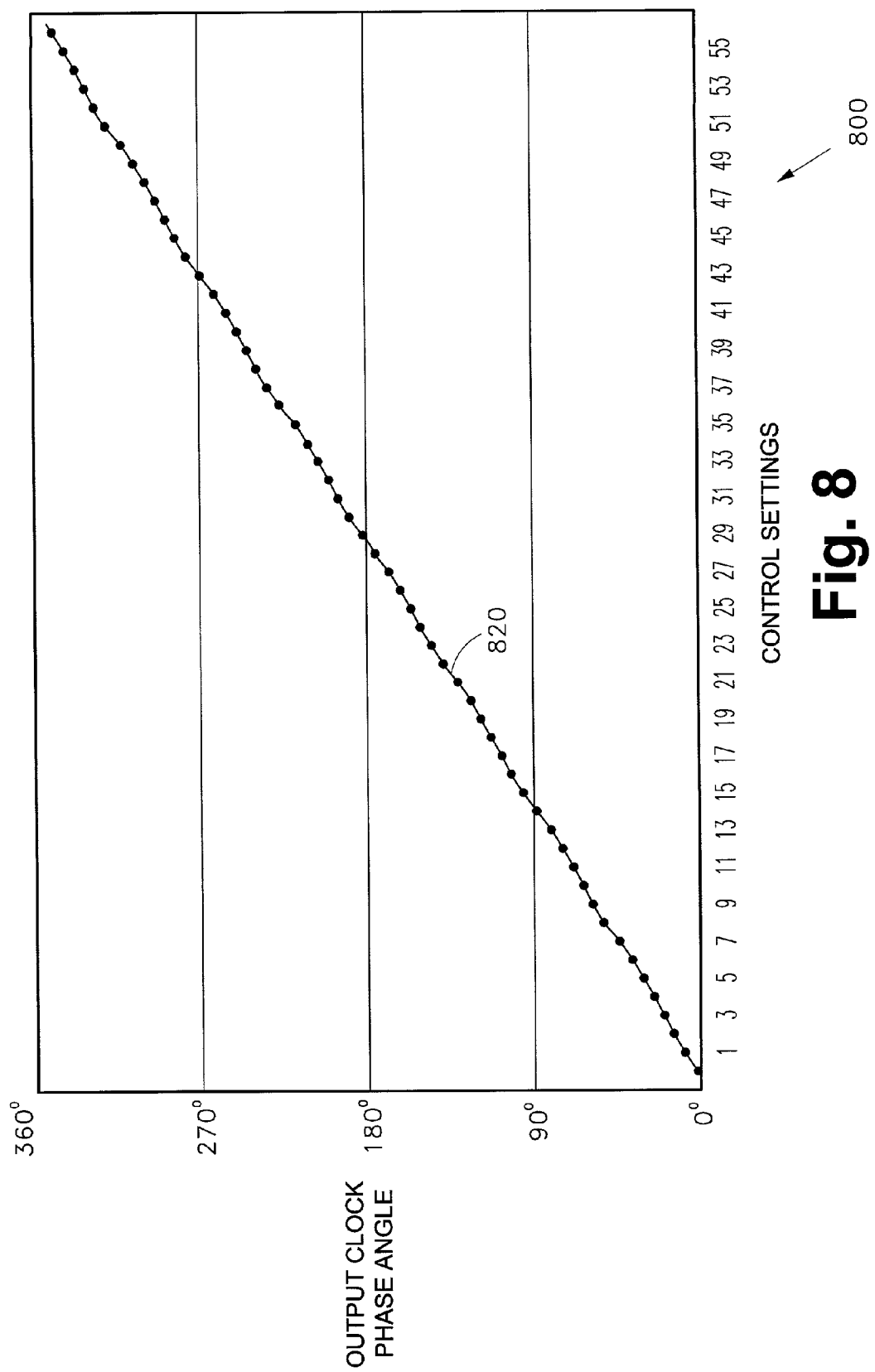
FIG. 8 is a graph of simulation results showing phase linearity of the clock phase interpolator of FIG. 7.

FIG. 8 is a graph of simulation results showing phase linearity of the clock phase interpolator of FIG. 7. Graph 800 shows the output clock phase angle 810 at 56 different interpolator control signal settings. The interpolator control signal settings correspond to the select signals and the current source control signals shown in FIG. 7. In some embodiments, these interpolator control signals correspond to the interpolator control signals on node 142 as shown in FIG. 1.

The 56 different settings for the interpolator control signals allow an average resolution of 6.4° across a 360° range. In other embodiments, higher resolution can be obtained through either increasing the resolution of the variable current sources, or increasing the number of available clock phases and corresponding differential transistor pairs.

Figure 9:
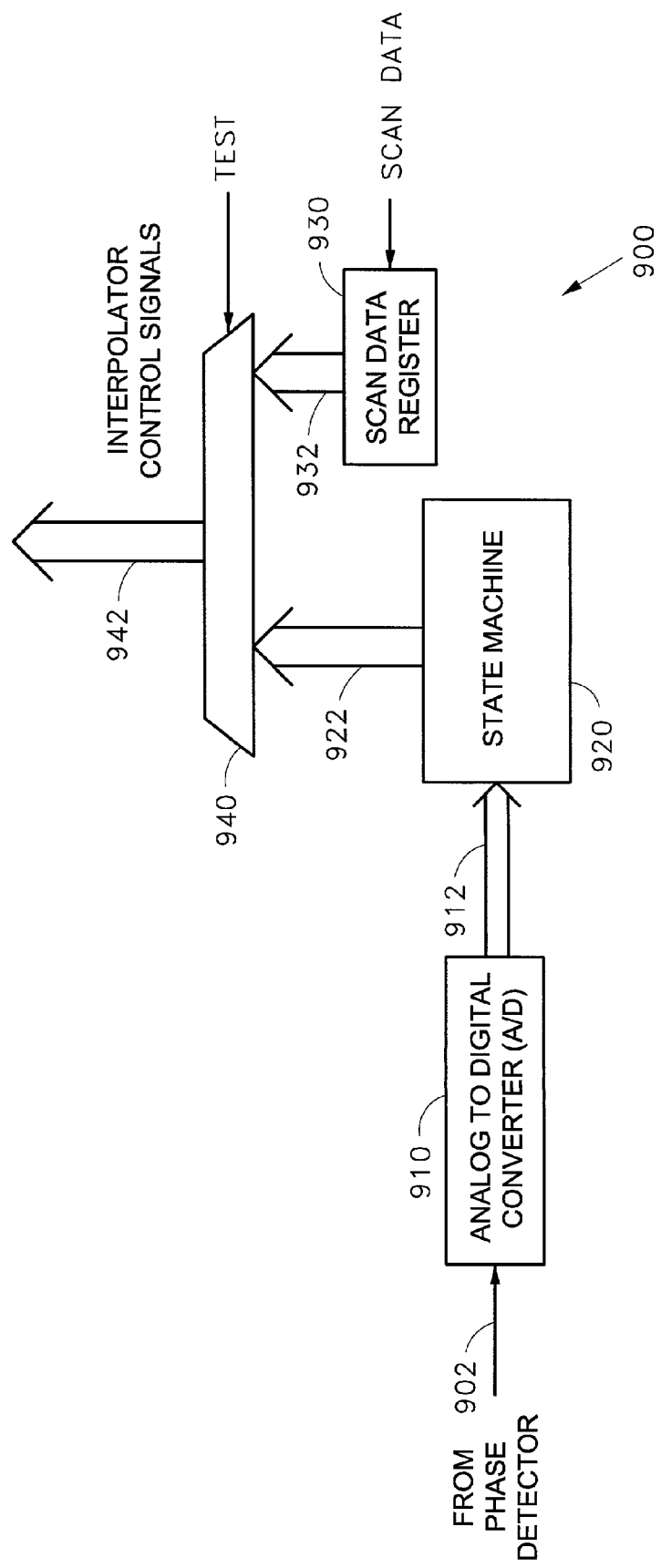
FIG. 9 shows a control logic circuit.

FIG. 9 shows a control logic circuit. Control logic circuit 900 corresponds to a control logic circuit for use in a clock recovery circuit such as control logic 140 (FIG. 1). Control logic circuit 900 includes analog to digital converter (A/D) 910, state machine 920, scan data register 930, and multiplexor 940. In embodiments represented by control logic circuit 900, the phase error signal on node 902 received from the phase detector is an analog voltage. A/D 910 receives the analog phase error signal on node 902 and provides a digital signal on node 912 to state machine 920. In response thereto, state machine 920 produces interpolator control signals on node 922. Multiplexer 940 selects between interpolator control signals on node 922 and scan data on node 932. In normal operation, multiplexer 940 selects interpolator control signals on node 922 that are produced by state machine 920. When undergoing test, multiplexer 940 receives signals on node 932 from scan data register 930.

State machine 920 can include any logic, sequential or otherwise, suitable to produce interpolator control signals from the data on node 912. Examples include finite impulse response (FIR) filters, decoders, multiplexers, or sequential state machines. In some embodiments, control logic circuit 900 receives digital data on node 902 from the phase detector. In these embodiments, control logic circuit 900 does not include an analog to digital converter, and state machine 920 receives digital data from the phase comparator directly.

Control logic circuit 900 is useful to provide interpolator control signals to a clock phase interpolator from either closed loop operation, or from test data. Although scan data register 930 is shown separate from state machine 920, in some embodiments, the scan registers are included as part of state machine 920. In these embodiments, interpolator control signals are produced directly from state machine 920 and multiplexor 940 is omitted.

Figure 10:
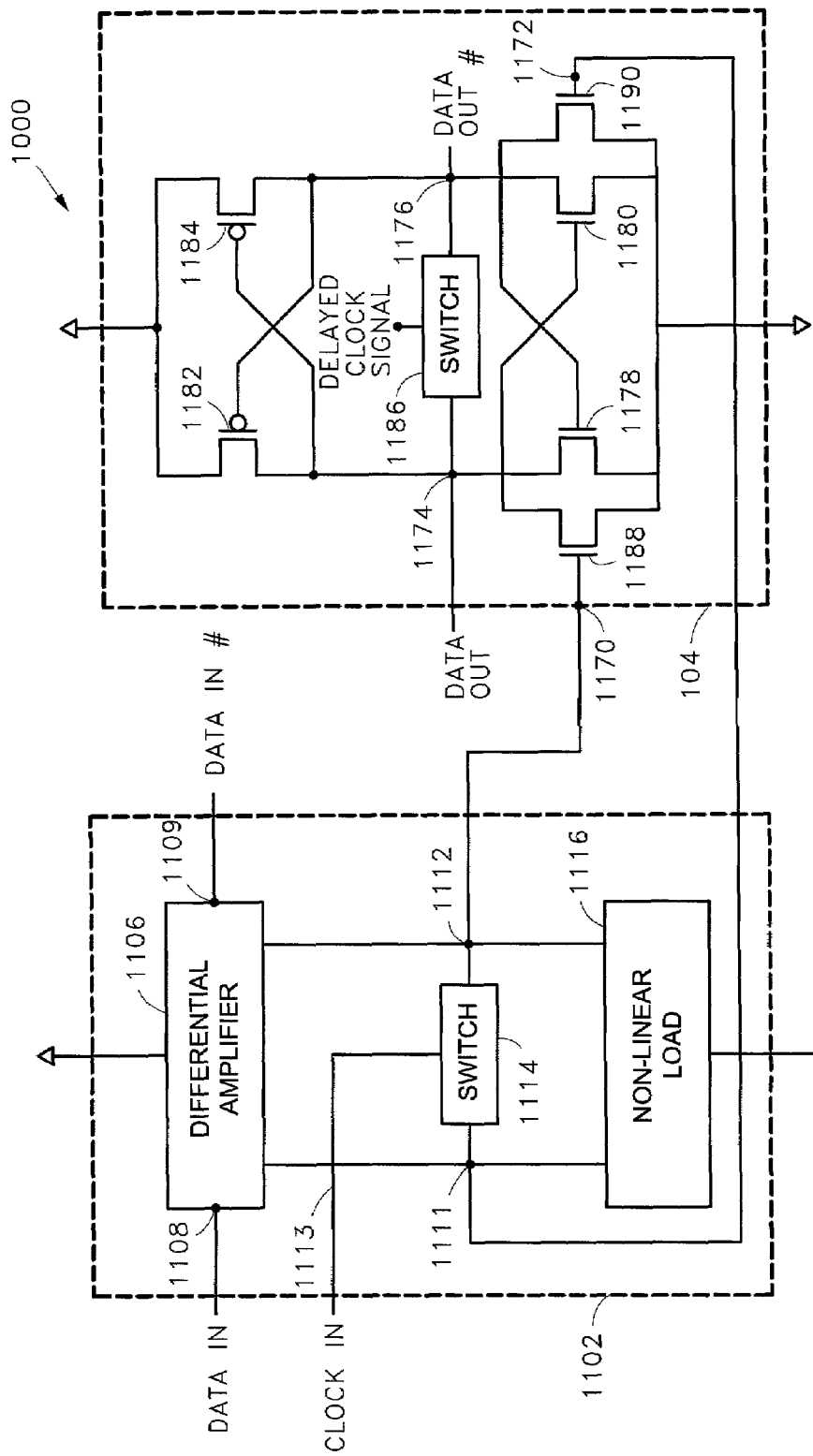
FIG. 10 shows a phase comparator.

FIG. 10 shows a phase comparator suitable for use as phase detector 130 (FIG. 1). Comparator 1000 includes a first amplifier stage 1102 and a second amplifier stage 1104. In some embodiments, first amplifier stage 1102 includes differential amplifier 1106, switch 1114, and non-linear load 1116. Differential amplifier 1106 includes a pair of input nodes 1108 and 1109 and a pair of output nodes 1111 and 1112. Switch 1114 and non-linear load 1116 are connected across the pair of output nodes 1111 and 1112.

Differential amplifier 1106 is not limited to a particular type of differential amplifier. In some embodiments, differential amplifier 1106 includes a high-gain linear differential amplifier. For example, in some embodiments, differential amplifier 1106 includes a differential pair of transistors, such as isolated gate field effect transistors. In other embodiments, differential amplifier 1106 includes multiple differential pairs of transistors configured in parallel. In some embodiments, these multiple pairs are n-channel isolated gate field-effect transistors. In still other embodiments, differential amplifier 1106 includes bipolar junction transistors.

Utilizing a differential pair of transistors or multiple differential pairs in parallel allows first amplifier stage 1102 to have a high bandwidth.

In operation, differential amplifier 1106 receives a DATA IN signal and a DATA IN # signal at the pair of input nodes 1108 and 1109, respectively, and generates an amplified signal at the pair of output nodes 1111 and 1112 by amplifying the difference between the DATA IN signal and the DATA IN #. DATA IN and DATA IN # are complementary signals that together form a differential signal that corresponds to DATA IN on node 124 (FIG. 1). Differential amplifier 1106 also receives a CLOCK IN signal on node 1113. This CLOCK IN signal corresponds to the clock signal on node 122 (FIG. 1).

Switch 1114 receives the clock signal on node 113, and is coupled to nodes 1111 and 1112. Switch 1114 is not limited to a particular type of switch. In some embodiments, switch 1114 is an electronically controllable switch. For example, switch 1114 can be implemented with an isolated gate field-effect transistor having a gate node coupled to node 1113, and source and drain nodes coupled between nodes 1111 and 1112. In other embodiments, switch 1114 is an optically controllable switch. For example, switch 1114 can be implemented with a photo-transistor. Using an optically controllable switch such as a photo-transistor for switch 1114 in comparator 1000 reduces the electrical noise in comparator 1000 by eliminating an electrical signal transmission line and the noise associated with an electrical signal transmission line from comparator 1000.

In operation, switch 1114, when closed, provides a conductive path between nodes 1111 and 1112 to equalize the potential at nodes 1111 and 1112. Switch 1114 can be closed by applying an electronic clock signal (not shown) to the gate of an isolated gate field-effect transistor switch, or by applying an optical clock signal (not shown) to the base (not shown) of a photo-transistor switch.

Non-linear load 116 is not limited to a particular type of non-linear load. In some embodiments, non-linear load 1116 includes a pair of cross-coupled n-channel, isolated gate field-effect transistors. In other embodiments, non-linear load 1116 includes a pair of cross-coupled bipolar junction transistors. In operation, non-linear load 1116 allows the signals at output nodes 1111 and 1112 to reach the supply voltages (not shown) and supports a higher slew rate or bandwidth for signals at output nodes 1111 and 1112 than a linear load.

Second amplifier stage 1104 is coupled to the pair of output nodes 1111 and 1112 of first amplifier stage 1102. Second amplifier stage 1104 includes a pair of second stage input nodes 1170 and 1172, a pair of second-stage output nodes 1174 and 1176, a pair of cross-coupled n-channel isolated gate field-effect transistors 1178 and 1180, a pair of cross-coupled p-channel isolated gate field-effect transistors 1182 and 1184, a switch 1186, and an input pair of n-channel isolated gate field-effect input transistors 1188 and 1190. The input pair of n-channel isolated gate field-effect input transistors 1188 and 1190 are coupled to the input nodes 1170 and 1172. The n-channel isolated gate field effect input transistor 1188 is connected in parallel with the n-channel isolated gate field-effect transistor 1178, and the n-channel isolated gate field-effect input transistor 1190 is connected in parallel with the n-channel isolated gate field-effect transistor 1180. The pair of cross-coupled p-channel isolated gate field-effect transistors 1182 and 1184 and the switch 1186 are connected between the second stage output nodes 1174 and 1176. Second amplifier stage 104 produces output signals DATA OUT and DATA OUT #, which form a differential signal that corresponds to the phase error signal on node 132 (FIG. 1).

Switch 1186 is coupled between nodes 1174 and 1176, and receives a delayed clock signal. In some embodiments, the delayed clock signal is a delayed version of CLOCK IN on node 1113. For example, the delayed clock signal can be generated using two inverters (not shown) coupled in series between node 1113 and the delayed clock signal input on switch 1186.

Second amplifier stage 1104 is a non-linear amplifier. Combining a nonlinear load in a first amplifier stage with a non-linear amplifier in the second stage amplifier allows the comparator to have a high gain.

In operation, phase comparator 1000 alternates between equalization phases and evaluation phases. For example, when the CLOCK IN signal is asserted, switch 1114 closes and equalizes the potential between nodes 1111 and 1112. Shortly thereafter, switch 1186 closes and equalizes the potential between nodes 1174 and 1176. The equalization phase occurs when switches 1114 and 1186 are closed. When the CLOCK IN signal is de-asserted, switch 1114 opens and nodes 1111 and 1112 begin to change state in response to the state of the input signals on nodes 1108 and 1109. Shortly thereafter, switch 1186 opens and second amplifier stage 1102 amplifies the difference between the signals on nodes 1170 and 1172. The evaluation phase occurs when both switches 1114 and 1186 are open.

It is to be understood that the above description is intended to be illustrative, and not restrictive. Many other embodiments will be apparent to those of skill in the art upon reading and understanding the above description. The scope of the invention should, therefore, be determined with reference to the appended claims, along with the full scope of equivalents to which such claims are entitled.

What is claimed is:

1. A clock phase interpolator circuit comprising:
   a first plurality of differential transistor pairs, a first plurality of select transistors, and a first current source, the first current source coupled to each of the first plurality of differential transistor pairs through one of the first plurality of select transistors; and
   a second plurality of differential transistor pairs, a second plurality of select transistors, and a second current source, the second current source coupled to each of the second plurality of differential transistor pairs through one of the second plurality of select transistors, wherein each differential transistor pair is configured to receive a different phase of a clock signal.

2. The clock phase interpolator circuit of claim 1 further comprising a control circuit to select one of the first plurality of differential transistor pairs and one of the second plurality of differential transistor pairs.

3. The clock phase interpolator circuit of claim 2 wherein the first and second current sources are variable current sources.

4. The clock phase interpolator circuit of claim 3 wherein the control circuit includes output nodes coupled to the first and second current sources to control currents sourced thereby.

5. The clock phase interpolator circuit of claim 3 wherein the first current source comprises a plurality of parallel-coupled current source transistors, each being individually selectable.

6. The clock phase interpolator circuit of claim 1 further comprising a differential amplifier coupled to output nodes of both the first and second plurality of differential transistor pairs.

7. The clock phase interpolator circuit of claim 6 wherein the first and second current sources are constant current sources.

8. A clock recovery circuit comprising:
an input clock node to receive a clock signal and an output clock node;
a first circuit to generate multiple clock phases from the clock signal on the input clock node;
a phase detector and control circuit to compare a phase of a data signal and a phase of a clock signal on the output clock node, and to create interpolator control signals, the phase detector including a clock node to receive the clock signal from the input output clock node, and a data node to receive the data signal; and
an interpolator circuit with a plurality of differential transistor pairs operative to switch current responsive to the multiple clock phases and interpolator control signals, to drive an output clock on the output clock node, wherein at least one first differential transistor pair of the plurality of differential transistor pairs is responsive to a first clock phase of the multiple clock phases, and wherein at least one second differential transistor pair of the plurality of differential transistor pairs is responsive to a second clock phase of the multiple clock phases.

9. A clock recovery circuit comprising:
an input clock node to receive a clock signal and an output clock node;
a first circuit to generate multiple clock phases from the clock signal on the input clock node;
a phase detector and control circuit to compare a phase of a data signal and a phase of a clock signal on the output clock node, and to create intervolator control signals, the phase detector including a clock node to receive the clock signal from the output clock node, and a data node to receive the data signal; and
an interpolator circuit with a plurality of differential transistor pairs operative to switch current responsive to the multiple clock phases and interpolator control signals, to drive an output clock on the output clock node, wherein the interpolator circuit comprises a first differential transistor pair responsive to a first clock phase, and a second differential transistor pair responsive to a second clock phase.

10. The clock recovery circuit of claim 9 wherein the interpolator circuit further comprises:
a first current source coupled to the first differential transistor pair; and
a second current source coupled to the second differential transistor pair.

11. The clock recovery circuit of claim 10 wherein the first and second current sources are variable current sources responsive to the interpolator control signals.

12. The clock recovery circuit of claim 10 wherein the first and second current sources are constant current sources.

13. A clock recovery circuit comprising:
an input clock node and an output clock node;
a first circuit to generate multiple clock phases from a clock signal on the input clock node;
a phase detector and control circuit to compare a phase of a data signal and a phase of a clock signal on the output clock node, and to create interpolator control signals; and an interpolator circuit with a plurality of differential transistor pairs operative to switch current responsive to the multiple clock phases and interpolator control signals, to drive an output clock on the output clock node, wherein the interpolator circuit further comprises:
a first plurality of differential transistor pairs having differential output nodes coupled in common;
a first current source coupled to source current through the first plurality of differential transistor pairs;
a second plurality of differential transistor pairs having differential output nodes coupled in common with the differential output nodes of the first plurality of differential transistor pairs;
a second current source coupled to source current through the second plurality of differential transistor pairs; and
a differential amplifier coupled to the differential output nodes to drive the output clock on the output clock node.

14. The clock recovery circuit of claim 13 further comprising a separate select transistor coupled between each differential transistor pair and a respective current source, the select transistors being responsive to the interpolator control signals.

15. The clock recovery circuit of claim 13 wherein the first and second current sources are fixed current sources.

16. The clock recovery circuit of claim 13 wherein the first and second current sources are variable current sources having input nodes responsive to the interpolator control signals.

17. An integrated circuit comprising:
a first differential transistor pair to receive a first clock signal at a first phase, the first differential transistor pair having a first differential output node;
a second differential transistor pair to receive a second clock signal at a second phase, the second differential transistor pair having a second differential output node coupled in common with the first differential output node;
a first variable current source coupled to the first differential transistor pair;
a second variable current source coupled to the second differential transistor pair;
a differential amplifier having a differential input node coupled to the first differential output node; and
a third differential transistor pair coupled in parallel with the first differential transistor pair between the first differential output node and the first current source.

18. The integrated circuit of claim 17 further comprising:
a fourth differential transistor pair coupled in parallel with the second differential transistor pair between the second differential output node and the second current source.

19. The integrated circuit of claim 18 further comprising:
a first select transistor coupled between the first differential transistor pair and the first current source;
a second select transistor coupled between the second differential transistor pair and the second current source;
a third select transistor coupled between the third differential transistor pair and the first current source; and
a fourth select transistor coupled between the fourth differential transistor pair and the second current source.

20. The integrated circuit of claim 19 further comprising a control circuit to select one of the first and second select transistors, and one of the third and fourth select transistors, and to select a first current to be provided by the first current source, and to select a second current to be provided by the second current source.

21. The integrated circuit of claim 17 further comprising a delay locked loop circuit coupled to the first and second differential transistor pairs, to provide the first and second clock signals from a received clock signal.

22. The integrated circuit of claim 21 further comprising a phase detector having input nodes coupled to an output node of the differential amplifier and to a data node to receive a data signal, and having an output node to provide a phase error signal.

23. The integrated circuit of claim 22 further comprising a control circuit to receive the phase error signal and to control the first and second variable current sources.

24. The integrated circuit of claim 23 wherein the phase comparator provides a digital error signal.

25. The integrated circuit of claim 23 wherein the phase comparator provides an analog error signal.

26. The integrated circuit of claim 25 wherein the control circuit includes an analog-to-digital converter.

* * * * *

UNITED STATES PATENT AND TRADEMARK OFFICE
CERTIFICATE OF CORRECTION

PATENT NO. : 7,180,352 B2
APPLICATION NO. : 09/894486
DATED : February 20, 2007
INVENTOR(S) : Mooney et al.

It is certified that error appears in the above-identified patent and that said Letters Patent is hereby corrected as shown below:

In column 11, line 17, in Claim 8, after "the" delete "input".

In column 11, line 37, in Claim 9, delete "intervolator" and insert --interpolator --, therefor.

Signed and Sealed this

First Day of May, 2007

JON W. DUDAS
*Director of the United States Patent and Trademark Office*